(12) United States Patent
Lang et al.

(10) Patent No.: US 11,428,590 B2
(45) Date of Patent: Aug. 30, 2022

(54) METHOD FOR ESTIMATING A BEARING LOAD USING STRAIN PARAMETERS TO ACCOUNT FOR CONTACT ANGLE VARIATION

(71) Applicant: AKTIEBOLAGET SKF, Gothenburg (SE)

(72) Inventors: Defeng Lang, Delft (NL); Hendrik Anne Mol, Sleeuwijk (NL); Stijn van Eesbeek, Doorn (BE); Henricus van Genuchten, Utrecht (NL)

(73) Assignee: AKTIEBOLAGET SKF, Gothenburg (SE)

( * ) Notice: Subject to any disclaimer, the term of this patent is extended or adjusted under 35 U.S.C. 154(b) by 301 days.

(21) Appl. No.: 16/916,235

(22) Filed: Jun. 30, 2020

(65) Prior Publication Data

US 2021/0010883 A1   Jan. 14, 2021

(30) Foreign Application Priority Data

Jul. 12, 2019   (DE) .......................... 102019210336.7

(51) Int. Cl.
| | | |
|---|---|---|
| *G01L 5/00* | (2006.01) | |
| *F16C 19/00* | (2006.01) | |
| *G06F 17/11* | (2006.01) | |
| *G06F 17/14* | (2006.01) | |
| *G06F 17/16* | (2006.01) | |

(Continued)

(52) U.S. Cl.
CPC .......... *G01L 5/0019* (2013.01); *F16C 19/522* (2013.01); *G01M 13/04* (2013.01); *G06F 17/11* (2013.01); *G06F 17/14* (2013.01); *G06F 17/16* (2013.01); *F16C 2233/00* (2013.01); *G01L 5/0023* (2013.01); *G06F 17/17* (2013.01); *G06F 30/17* (2020.01); *G06F 30/20* (2020.01)

(58) Field of Classification Search
CPC .... G01L 5/0019; G01L 5/0023; F16C 19/522; F16C 2233/00; G01M 13/04; G06F 17/11; G06F 17/14; G06F 17/16; G06F 17/17; G06F 30/17; G06F 30/20
USPC ....... 702/189, 190, 194, 124; 703/1, 2, 7, 20
See application file for complete search history.

(56) References Cited

U.S. PATENT DOCUMENTS

| | | |
|---|---|---|
| 7,444,888 B2 | 11/2008 | Mol et al. |
| 10,018,524 B2 | 7/2018 | Mol |

(Continued)

FOREIGN PATENT DOCUMENTS

| | | | | |
|---|---|---|---|---|
| CN | 107003194 A | * | 8/2017 | ............ F16C 19/522 |
| DE | 102016217943 A1 | | 3/2017 | |

(Continued)

*Primary Examiner* — Phallaka Kik
(74) *Attorney, Agent, or Firm* — J-Tek Law PLLC; Scott T. Wakeman; Mark A. Ussai

(57) ABSTRACT

A method for estimating a bearing load in a bearing having a first ring, a second ring and a row of rolling elements arranged between the first ring and the second ring, the method including: equipping the first ring with at least one strain sensor probe, transmitting a strain signal waveform from the at least one strain sensor probe to an electronic control unit, extracting shape information of the waveform of the strain signal using a first harmonic component (u) and a second harmonic component (v) of the strain signal, and calculating a bearing load estimation as a polynomial function of the first and second harmonic components (u, v) of the strain signal.

10 Claims, 2 Drawing Sheets

(51) Int. Cl.
*G06F 17/17* (2006.01)
*G06F 30/17* (2020.01)
*G06F 30/20* (2020.01)
*G01M 13/04* (2019.01)
*F16C 19/52* (2006.01)

(56) References Cited

U.S. PATENT DOCUMENTS

| | | | |
|---|---|---|---|
| 11,085,489 B2* | 8/2021 | Epps | G01M 13/045 |
| 2012/0035757 A1* | 2/2012 | Mawby | B29D 30/0633 |
| | | | 700/104 |
| 2012/0095587 A1* | 4/2012 | Hair, Jr. | G05B 19/41875 |
| | | | 700/110 |
| 2013/0211742 A1 | 8/2013 | Mol | |
| 2013/0321824 A1* | 12/2013 | Hockaday | G01L 1/24 |
| | | | 356/614 |
| 2014/0230535 A1* | 8/2014 | Okada | G01M 17/022 |
| | | | 73/146 |
| 2015/0165705 A1* | 6/2015 | Mawby | G01M 17/02 |
| | | | 702/84 |
| 2015/0246588 A1* | 9/2015 | Mawby | G05B 19/41865 |
| | | | 700/105 |
| 2017/0115187 A1* | 4/2017 | Symens | G01M 17/022 |
| 2018/0283988 A1* | 10/2018 | Ooe | G01N 29/24 |
| 2020/0149585 A1* | 5/2020 | Epps | G01M 13/045 |
| 2021/0033528 A1* | 2/2021 | Katsu | G01M 15/05 |
| 2021/0182298 A1* | 6/2021 | Gray | G06F 16/248 |

FOREIGN PATENT DOCUMENTS

| | | | | |
|---|---|---|---|---|
| GB | 2542422 A | | 3/2017 | |
| JP | 2008542735 A | * | 11/2008 | G01M 17/10 |
| JP | 2015059844 A | * | 3/2015 | |
| WO | 2009056334 A1 | | 5/2009 | |
| WO | 2011006523 A1 | | 1/2011 | |
| WO | 2011128047 A1 | | 10/2011 | |
| WO | WO-2016096418 A1 | * | 6/2016 | F16C 19/522 |

* cited by examiner

METHOD FOR ESTIMATING A BEARING LOAD USING STRAIN PARAMETERS TO ACCOUNT FOR CONTACT ANGLE VARIATION

CROSS-REFERENCE

This application claims priority to German patent application no. 10 2019 210 336.7 filed on Jul. 12, 2019, the contents of which are fully incorporated herein by reference.

TECHNOLOGICAL FIELD

The present disclosure is directed to methods and systems for estimating bearing loads.

BACKGROUND

In order to sense bearing loads, it is known to calculate the rolling element load from a strain signal at a sensor location for each rolling element passing by the sensor. In a second step, bearing load is reconstructed from the rolling element loads.

The strain depends on the size and direction of the rolling element load and the location and orientation of the area where the sensor is located with respect to the rolling element load vectors.

Other bearing load estimating methods calculate a measure of signal amplitude in order to estimate a load. Known calculation methods use peak-to-peak (PKP) methods, root mean square methods, or average of absolute strain value.

It is also known to measure a load acting on a static non-rotating bearing using an array of strain sensors integrated into the fixed stationary ring of a bearing.

Reference can be made to documents US 2013/0211742 A1, U.S. Pat. No. 7,444,888 B2 and WO 2011/128047 A1 which describe sensor bearings equipped with strain sensors along with methods for determining a load vector acting on a bearing having rolling elements. Typically, the measured strain signals for each sensor include a series of sharp peaks corresponding to the passing rolling elements. The load detection may comprise analyzing, for example averaging over a certain time period, the signal over at least some of the signal peaks to achieve reliable information.

However, known methods may have incorrect reconstruction of the actual total bearing load since the measured strain signal changes due to change of the contact angle. In other words, the deviation of the contact angle of the rolling elements changes the transfer function of bearing load and strain signal.

Because of this, methods using peak-to-peak strain to calculate the bearing load may contain estimation uncertainty.

In order to improve the accuracy of bearing load estimating methods, global and local strains have been used to estimate bearing loads.

However, none of those methods remove errors due to rolling element contact angle variations.

SUMMARY

There is thus a need to remove errors due to rolling element contact angle variation in bearing load estimating methods.

The aim of the present disclosure is consequently to provide a bearing load estimating method with improved accuracy that takes into consideration the variations in the contact angles of the rolling elements.

One aspect of the present disclosure provides a load estimating method for estimating a bearing load which is implemented in an electronic control unit of a bearing assembly having a bearing, the bearing comprising a first ring, a second ring, a row of rolling elements arranged therebetween, one of the rings being equipped with at least one strain sensor probe configured to transmit strain signals to the electronic control unit.

The method includes extracting shape information of the waveform of the strain signal using harmonic components of the strain signal.

The method further comprises calculating a bearing load estimation as a polynomial function of the harmonic components of the strain signal.

Load estimations are thus calculated using the contact angle parameters representing the contact angle variation. The contact angle is estimated from the harmonic components in the strain signal.

In an embodiment, the load estimating method comprises:

extracting shape information of the waveform of the strain signal using at least a first and a second harmonic components of the strain signal;

expressing, in scalars, the first and second harmonic components of the rolling element waveform previously extracted; and calculating a bearing load estimation as a polynomial function of the calculated first and second harmonic ratio, the sensor probe positions and calibration constants.

The ratio of the power of said first and second harmonic components describes the relationship with the contact angle variation.

In another embodiment, the load estimating method uses more than one strain sensor probe per rolling element spacing in the running direction, for example two strain sensor probes, thus sampling in the spatial domain rather than in the time domain. The sensor probes are regularly circumferentially spaced.

The method includes:

extracting shape information of the waveform of the strain signal using at least first and second harmonic components of the strain signals from the regularly spaced sensor probes;

expressing in scalars the first and second harmonic components of the rolling element waveform previously extracted; and calculating a bearing load estimation as a polynomial function of the calculated first and second harmonic ratio, the sensor probes positions and calibration constants.

For example, the load estimating method uses two rows of at least one sensor probe per row for measuring the strain depending on the contact angle and calculating harmonics of the two rows, thus further improving the accuracy of the load reconstruction at the location of the rolling element.

Advantageously, the load estimating method uses more than one strain sensor probe per rolling element spacing placed on one of the ring, for example three, five or seven, allowing the measurement of specific harmonic components of the strain signal due to the rolling element load vector size and direction with correct rejection of low order bending modes under which the ring is also subjected thus increasing the accuracy of the load reconstruction.

Each strain sensor probe may, for example, comprise a thin film direct deposited strain gauge using an insulating coating between the ring and a estimating grid, and a grid that has been deposited by screen printing and laser annealing of the sensor probe's metallic layer into a functional grid.

Other types of strain sensor probes may be used, for example a thick film on steel strain gauge, which comprises thin plates or structures that are attached to the ring at two lines using welding (laser in particular as described in WO 2011/006523 A1 and WO 2009/056334 A1) and placed and dimensioned such that they are meaningfully observing the first and second harmonic of the strain difference on the surface at the two weld lines.

Alternatively, each strain sensor probe comprises a fiber optic-based strain gauge glued on one of the rings or inside a groove made in the ring.

In another embodiment, the sensor probes comprise at least one displacement sensor in at least one row for observing the relative movement in radial and circumferential directions due to the rolling element load passing under the cavity or groove or pocket otherwise occupied by a strain sensor. The movement represents in harmonic terms the load and the direction of load, and the calculation method presented is valid for the estimation of the load.

BRIEF DESCRIPTION OF THE DRAWINGS

The present invention and its advantages will be better understood by studying the detailed description of specific embodiments given by way of non-limiting examples and illustrated by the appended drawings on which.

DETAILED DESCRIPTION

Figure 1:
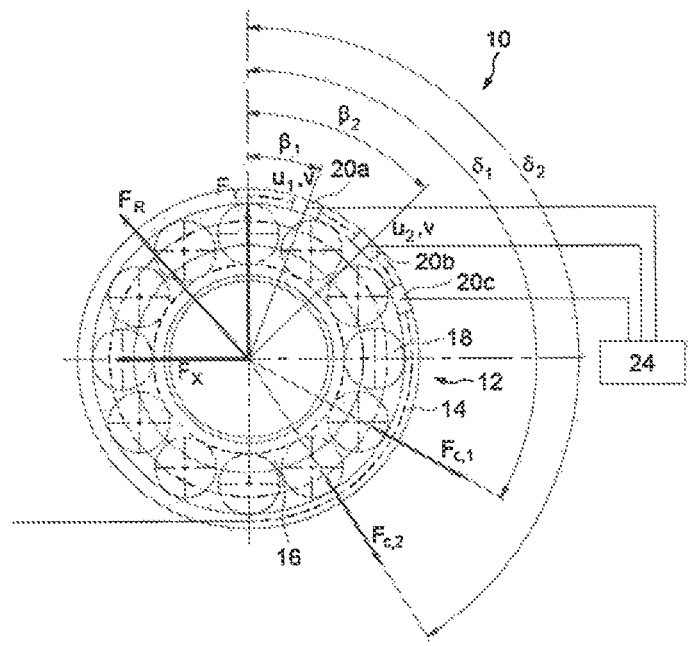
FIGS. 1 and 2 are schematic half-section views of a bearing assembly showing bearing forces and angles.
Figure 2:
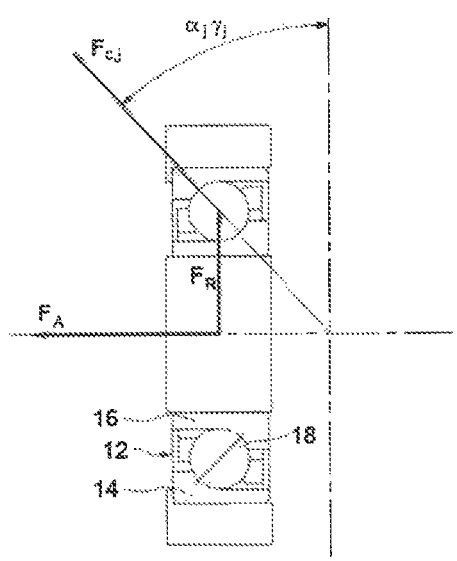

Referring first to FIGS. 1 and 2, which illustrate an embodiment of a bearing assembly 10 with a bearing 12 the load on which is designed to be sensed by a load estimating method according to the disclosure.

The bearing 12 comprises a stationary outer ring 14 as a first ring, a rotating inner ring 16 as a second ring, a row of rolling elements 18, such as balls, arranged therebetween, and a cage (not shown).

The bearing 12 may be of the ball bearing type.

As illustrated, the outer ring 14 of the bearing 12 is equipped with strain sensor probes 20a, 20b, 20c. The strain sensor probes 20a to 20c may be strain gauges, for example micro measurements, mounted on the radially outer surface of the outer ring 14 or in a defined groove or pocket (not shown).

The disclosure is not limited to this example. Indeed, the inner or outer ring of the bearing may be equipped with a different number of strain sensor probes, for example at least one strain sensor probe.

The strain sensor probes 20a to 20c are connected to an electronic control unit, ECU 24, configured to receive and process signals obtained by the strain sensor probes 20a-20c when the bearing 12 is running or stationary and to estimate a bearing load.

A load estimating method 30 is implemented in the electronic control unit 24. The load estimating method 30 is applicable to all bearing estimating devices having at least one strain sensor.

The load estimating method 30 is configured to use additional signal properties, such as the shape information of the waveform in order to improve the accuracy of the contact angle estimation.

Indeed, known methods using peak-to-peak (PKP) methods or root mean square methods (RMS) only use an amplitude measure of the signal and are thus not accurate since they do not consider changes of contact angle.

The contact angle has an influence on the transfer function from rolling element load to sensor signal. The two basic signal characteristics of the output of the transfer function that are influenced by contact angle are the gain and shape of the waveform that is perceived at the sensor when a rolling element is passing.

The aim of the load estimating method 30 is to reduce the dependency of the transfer function on contact angle.

The load estimating method 30 uses contact angle parameters u, v, which are the scalar representations of the first and second harmonic, as input to estimate bearing loads. As will be further described, those contact angle parameters u, v are combined with calibration parameters to calculate an estimation of axial and radial loads on the bearing.

The axial load $F_A$ on the bearing equals the sum of the axial components of the Z rolling element load vectors $F_{c,j}$, where j is the index of the rolling element. Axial components can be written using the contact angle $\alpha j$ of the contact load according to the equation below:

$$F_A = \sum_{j=1}^{Z} \sin\alpha_j \cdot F_{c,j} \qquad [\text{Eq. 1}]$$

Radial load in x and y direction can be written as the sum of the x and y projections of the radial components of all rolling element load vectors. They are defined by the angular position $\delta_i$ of the rolling elements as follows:

$$F_X = \sum_{j=1}^{Z} \cos\delta_j \cdot \cos\alpha_j \cdot F_{c,j} \qquad [\text{Eq. 2}]$$

$$F_y = \sum_{j=1}^{Z} \sin\delta_j \cdot \cos\alpha_j \cdot F_{c,j} \qquad [\text{Eq. 3}]$$

Axial projection x is done using the contact angle $\gamma_i$ at the strain sensor position $\beta_i$.

Axial load estimation $\hat{F}_A$ can be written using a function c as follows:

$$\hat{F}_A = \sum_{i=1}^{N} c \cdot \sin\gamma_i \cdot u_i \approx \sum_{j=1}^{Z} \sin\alpha_j \cdot F_{c,j} \qquad [\text{Eq. 4}]$$

This assumption avoids explicit calculation of the roller loads and rolling element positions.

Likewise, estimations of radial load in x and y directions can be defined using the angular position of the strain sensors $\beta_i$ as follows:

$$\hat{F}_x = \sum_{i=1}^{N} c \cdot \cos\beta_i \cdot \cos\gamma_i \cdot u_i \qquad [\text{Eq. 5}]$$

-continued $$\hat{F}_y = \sum_{i=1}^{N} c \cdot \sin\beta_i \cdot \cos\gamma_i \cdot u_i \quad \text{[Eq. 6]}$$

In equations 4 to 6, $u_i$ is a contact angle parameter derived from measurements. The sensor positions $\beta_i$ are assumed known and c represents an arbitrary constant mapping strain to load.

The load estimating method 30 comprises a first step 32 where shape information of the waveform is extracted using at least a first and a second harmonic components u, v of the signal where u and v are contact angle parameters. The combination of those parameters is used to provide information about amplitude as well as on the shape of the waveform, since the shape changes with contact angle variations.

Shape information is quantified as power of the sinusoid harmonics. Multiple methods may be used to separate the harmonics from the signal, such as for example Kalman filtering, vector projection, and Fourier transformation. Those methods are known and will not be further described.

At block 34, the first and second harmonic components u, v of the rolling element 18 waveform extracted at block 32 are expressed in scalars. The ratio of power of said first and second harmonic components u, v is thus calculated. Said ratio represents the contact angle variation.

At block 36, the contact angle of the rolling element 18 is estimated depending of the ratio calculated at block 34 as follows:

$$c \cdot \sin\gamma_i = C(u, v) = c_{ui} + c_{vi} * \frac{v_i}{u_i} \quad \text{[Eq. 7]}$$

At block 38, bearing load estimation is calculated as a polynomial function of the first and second harmonic power scalars.

Axial load estimation is calculated by substituting equation 7 in equation 4 as follows:

$$\hat{F}_A = \sum_{i=1}^{N} c_{ui} \cdot u_i + c_{vi} \cdot v_i \quad \text{[Eq. 8]}$$

Constants $c_{ui}$ and $c_{vi}$ as are written dependent on strain parameters using calibration constants k:

$$c_{ui} = k_{ui1} + k_{ui2} \cdot u_i \quad \text{[Eq. 9a]}$$

and $$c_{vi} = k_{vi1} + k_{vi2} \cdot v_i \quad \text{[Eq. 9b]}$$

Substituting equations 9a and 9b in equation 8, the axial load estimation for a single measurement is written as follows:

$$\hat{F}_A = \sum_{i=1}^{N} k_{ui1} \cdot u_i + k_{ui2} \cdot u_i^2 + k_{vi1} \cdot v_i + k_{vi2} \cdot v_i^2 \quad \text{[Eq. 10]}$$

$$\hat{F}_A = [U1\ U2\ V1\ V2] = \begin{bmatrix} k_{Au1} \\ k_{Au2} \\ k_{Au3} \\ k_{Au4} \end{bmatrix} \quad \text{[Eq. 11]}$$

Where:
Un, Vn are matrices containing u and v harmonic components; and
$K_A$ is a 4 N×1 column vector.

The disclosure is not limited to the number 4 and the use of two harmonic components. Indeed, the load estimation may be calculated using higher orders and/or harmonics without loss of validity of the calculation.

The polynomial function of the axial load estimation thus excludes contact angle, which improves the accuracy of the load estimating method.

With similar reasoning, radial load estimation can be calculated based on strain parameters and calibration constants.

In a general way, load estimations are calculated using the contact angle parameters $u_i$, $v_i$ representing the contact angle variation, the sensor positions $\beta_i$ and calibration constants k. The contact angle $\gamma_i$ is not directly calculated, but implicitly estimated from the strain signal.

Figure 3:
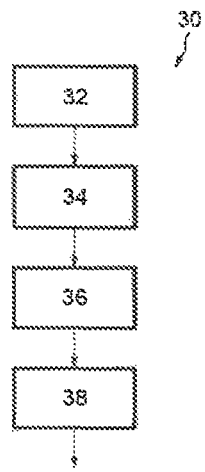
FIG. 3 is a flowchart outlining a bearing load estimating method according to an embodiment of the invention.

Thanks to said method, bearing load is estimated with higher accuracy compared to known methods, as can be seen on FIG. 3.

Thanks to the load estimating method, signal components are used to get the influence of the contact angle out of the equation for estimating the load.

Harmonic components are thus used as an indication of contact angle variation to improve the accuracy of load estimating.

Figure 4:
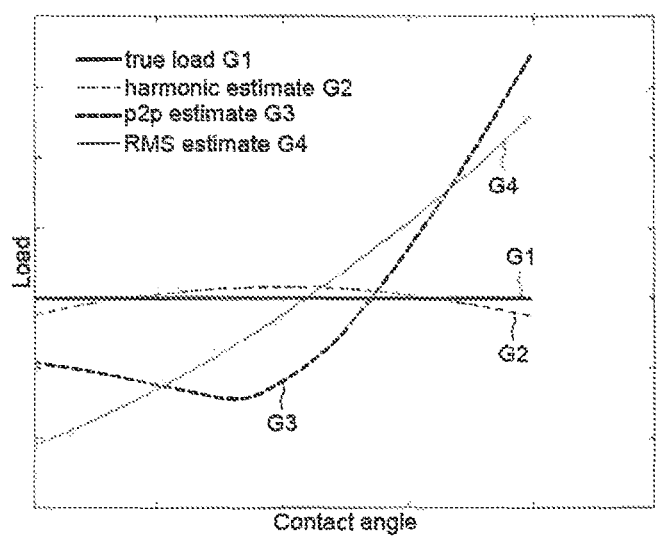
FIG. 4 is a graph showing the relation between a bearing load estimation using various estimated methods and the contact angle of the rolling elements.

FIG. 4 is a graph with four curves G1, G2, G3, G4 showing the relation between the bearing load and the contact angle of the rolling elements.

The graph G1 in plain line illustrates the relation between true bearing load and the bearing element contact angle.

The graph G2 in dashed dotted lines illustrates the relation between the bearing load estimated according to the method of FIG. 2 and the bearing element contact angle.

The graph G3 in dashed lines illustrates the relation between the bearing load estimated according to a method using peak-to-peak and the bearing element contact angle.

The graph G4 in dotted lines illustrates the relation between the bearing load estimated according to a method using root mean square and the bearing element contact angle.

According to FIG. 4, it can be seen that the estimated bearing load of the method according to the disclosure is particularly close to the real bearing load. The impact of the contact angle variation is thus removed from the bearing load estimating method according to the disclosure.

Representative, non-limiting examples of the present invention were described above in detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved methods for estimating bearing loads.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

What is claimed is:

1. A method for estimating a bearing load in a bearing comprising a first ring, a second ring and a row of rolling elements arranged between the first ring and the second ring, the method comprising:
    equipping the first ring with at least one strain sensor probe,
    generating a strain signal waveform using the at least one strain sensor probe,
    transmitting the strain signal waveform from the at least one strain sensor probe to an electronic control unit,
    extracting shape information of the waveform using a first harmonic component (u) and a second harmonic component (v) of the strain signal waveform; and
    calculating a bearing load estimation as a polynomial function of the first and second harmonic components (u, v) of the strain signal.

2. The load estimating method according to claim 1, including:
    expressing in scalars the first and second harmonic components (u, v) of the strain signal waveform; and
    calculating a ratio of the scalar of the first harmonic component and the scalar of the second harmonic component;
    wherein calculating a bearing load estimation comprises calculating a bearing load estimation as a polynomial function of the ratio, positions ($\beta_i$) of the sensor probes and at least one calibration constant (k).

3. The load estimating method according to claim 1, wherein equipping the first ring comprises equipping the first ring with a plurality of strain sensor probes per rolling element spacing in a running direction, the plurality of sensor probes being regularly circumferentially spaced.

4. The load estimating method according to claim 1, including using two rows of at least one sensor probe per row for measuring the strain depending on the contact angle and calculating harmonics of the two rows.

5. The load estimating method according to claim 1, wherein the plurality of strain sensors comprises an odd number of strain sensors per rolling element spacing.

6. The load estimating method according to claim 1, where each strain sensor probe comprises a thin film direct deposited strain gauge using an insulating coating between the ring and an estimating grid, and a functional grid that has been deposited by screen printing and laser annealing of the sensor probe's metallic layer.

7. The load estimating method according to claim 1, wherein each strain sensor probe comprises a fiber optic-based strain gauge glued on the first ring.

8. The load estimating method according to claim 1, wherein the sensor probes comprise at least one displacement sensor.

9. A bearing assembly comprising:
    a bearing having a first ring equipped with at least one strain sensor probe, a second ring, and a row of rolling elements arranged between the first ring and the second ring, and
    an electronic control unit configured to receive and process a strain signal waveform transmitted from the strain sensor probe to the electronic control unit,
    the electronic control unit being configured to:
    extract shape information of the waveform of the strain signal using a first harmonic component (u) and a second harmonic component (v) of the strain signal; and
    calculate a bearing load estimation as a polynomial function of the first and second harmonic components (u, v) of the strain signal.

10. A method for estimating a bearing load in a bearing comprising a first ring, a second ring and a row of rolling elements arranged between the first ring and the second ring, the method comprising:
    equipping the first ring with at least one strain sensor probe,
    generating a strain signal waveform using the at least one strain sensor probe,
    transmitting the strain signal waveform from the at least one strain sensor probe to an electronic control unit,
    extracting a first harmonic component (u) and a second harmonic component (v) of the strain signal;
    calculating a ratio of the first harmonic component and the second harmonic component; and
    calculating a bearing load estimation as a polynomial function of the ratio.

* * * * *